(12) United States Patent
Kageyama et al.

(10) Patent No.: US 9,395,396 B2
(45) Date of Patent: *Jul. 19, 2016

(54) SHUNT RESISTANCE TYPE CURRENT SENSOR

(71) Applicant: YAZAKI CORPORATION, Tokyo (JP)

(72) Inventors: Emi Kageyama, Shizuoka (JP); Takashi Sato, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/413,551

(22) PCT Filed: Jun. 19, 2013

(86) PCT No.: PCT/JP2013/067427
§ 371 (c)(1),
(2) Date: Jan. 8, 2015

(87) PCT Pub. No.: WO2014/010411
PCT Pub. Date: Jan. 16, 2014

(65) Prior Publication Data
US 2015/0177291 A1 Jun. 25, 2015

(30) Foreign Application Priority Data
Jul. 11, 2012 (JP) ................... 2012-155187

(51) Int. Cl.
G01R 19/32 (2006.01)
G01R 31/36 (2006.01)
(Continued)

(52) U.S. Cl.
CPC ................ *G01R 19/32* (2013.01); *G01R 1/203* (2013.01); *G01R 15/146* (2013.01); *G01R 31/3696* (2013.01)

(58) Field of Classification Search
USPC .............. 324/105, 76.11, 126, 426, 431, 433, 324/522, 538, 601, 705, 120; 429/90, 178, 429/432; 320/150, 153, 157; 338/49, 7; 361/103, 624, 719, 86; 374/E7.042, 1, 374/E1.005, 137; 340/584, 636.13, 870.17
See application file for complete search history.

(56) References Cited

U.S. PATENT DOCUMENTS 5,446,372 A 8/1995 Berkcan
6,489,693 B1 * 12/2002 Hetzler .............. G01R 19/0092
307/10.1

(Continued)

FOREIGN PATENT DOCUMENTS

DE 38 19 370 A1 12/1989
DE 10 2006 006 328 A1 8/2006
(Continued)

OTHER PUBLICATIONS

Database WPI Week 201228; Thomson Scientific, London, GB; XP002713151.

(Continued)

*Primary Examiner* — Melissa Koval
*Assistant Examiner* — Nasima Monsur
(74) *Attorney, Agent, or Firm* — Kenealy Vaidya LLP

(57) ABSTRACT

A shunt resistance type current sensor includes a bus bar that is a path of an electric current to be measured, a circuit board that is installed over the bus bar, a pair of connecting members that electrically connect the circuit board with the bus bar, a voltage detection unit that is provided on the circuit board and detects a voltage value applied to the circuit board through the pair of connecting members so as to calculate a level of the electric current flowing through the bus bar, and a temperature sensor that is provided on the circuit board to face the bus bar and detects a temperature of the bus bar to allow the voltage detection unit to perform a correction regarding the calculation of the level of the electric current.

3 Claims, 3 Drawing Sheets

(51) Int. Cl.
  *G01R 1/20* (2006.01)
  *G01R 15/14* (2006.01)

(56) References Cited

U.S. PATENT DOCUMENTS

| | | | | |
|---|---|---|---|---|
| 2004/0229097 | A1* | 11/2004 | Hirakata | H01M 8/04007 429/442 |
| 2007/0257659 | A1* | 11/2007 | Nomoto | G01R 15/202 324/76.11 |
| 2008/0030208 | A1* | 2/2008 | Aratani | G01R 1/203 324/713 |
| 2009/0039836 | A1* | 2/2009 | Asada | G01K 1/14 320/152 |
| 2011/0089931 | A1 | 4/2011 | Podlisk et al. | |

FOREIGN PATENT DOCUMENTS

| | | |
|---|---|---|
| DE | 10 2009 044 992 A1 | 4/2011 |
| GB | 2473014 A | 3/2011 |
| JP | 5-63041 A | 3/1993 |
| JP | 2009-40314 A | 2/2009 |
| JP | 2012-78328 A | 4/2012 |
| WO | 2006/087342 A1 | 8/2006 |

OTHER PUBLICATIONS

International Search Report and Written Opinion of the International Search Report for PCT/JP2013/067427 dated Sep. 27, 2013.
Japanese Office Action for the related Japanese Patent Application No. 2012-155187 dated Mar. 29, 2016.

* cited by examiner

FIG. 1A
FIG. 1B
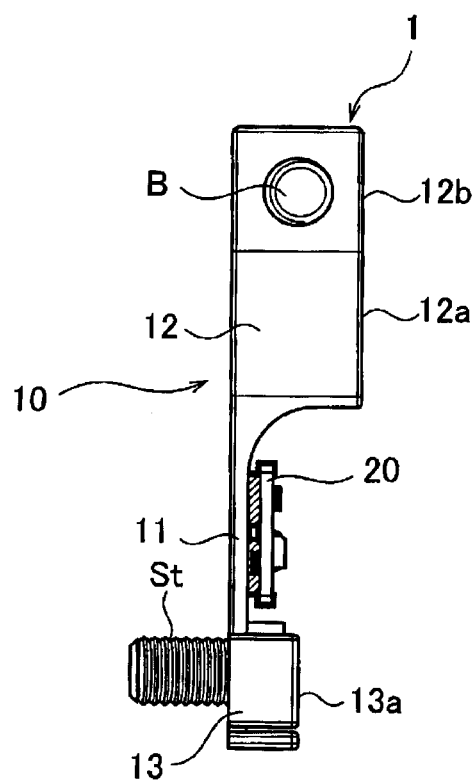
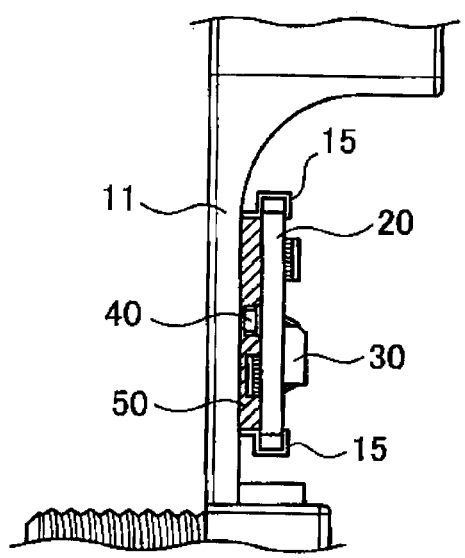

SHUNT RESISTANCE TYPE CURRENT SENSOR

TECHNICAL FIELD

The present invention relates to a shunt resistance type current sensor.

BACKGROUND ART

In general, to detect a pulse electric current, a large alternating electric current or the like, shunt resistance type current sensors are proposed in which an electric current to be measured is supplied to a shunt resistance portion having a known resistance value and a voltage drop generated in the shunt resistance portion is detected, thereby detecting a magnitude of the electric current to be measured. In the shunt resistance type current sensors, because the resistance value of the shunt resistance portion is changed depending on a temperature thereof, the temperature of the shunt resistance portion is detected and then the resistance value is corrected based on the temperature. For this reason, a temperature sensor, together with a voltage detection IC for detecting a voltage drop to detect a magnitude of an electric current to be measured, is mounted on a circuit board.

For example, according to PTL 1, a bus bar connected to a negative terminal of a battery also serves as a shunt resistance portion for detecting a magnitude of an electric current of the battery. In this case, the bus bar and a circuit board are electrically connected to each other by two poles for detecting a potential difference caused by the shunt resistance portion, and a temperature sensor is disposed on a portion of the circuit board adjacent to one pole.

CITATION LIST

Patent Literature

PTL 1: JP-A-2009-40314

SUMMARY OF INVENTION

Technical Problem

However, an accuracy of bus bar temperature detection significantly influences an accuracy of electric current detection. As a result, a problem is caused in that a predetermined accuracy of electric current detection cannot be kept when an abnormality of the temperature sensor arises and thus a large difference between a temperature of the shunt resistance portion and a temperature detected by the temperature sensor occurs.

Accordingly, the present invention has been made keeping in mind the above problem, and an object of the invention is to provide a shunt resistance type current sensor, in which a predetermined accuracy of electric current detection can be ensured by determining an abnormality of a temperature sensor.

Solution to Problem (1) According to an aspect of the invention, a shunt resistance type current sensor includes a bus bar that is a path of an electric current to be measured, a circuit board that is installed over the bus bar, a pair of connecting members that electrically connect the circuit board with the bus bar, a voltage detection unit that is provided on the circuit board and detects a voltage value applied to the circuit board through the pair of connecting members so as to calculate a level of the electric current flowing through the bus bar, and a temperature sensor that is provided on the circuit board to face the bus bar and detects a temperature of the bus bar to allow the voltage detection unit to perform a correction regarding the calculation of the level of the electric current. The voltage detection unit includes a temperature detection portion for detecting the temperature of the bus bar, and determines an abnormality of the temperature sensor based on the temperature detected by the temperature detection portion and the temperature detected by the temperature sensor.

(2) In the shunt resistance type current sensor of (1), the voltage detection unit determines that the temperature sensor is abnormal, when a difference between the temperature detected by the temperature detection portion and the temperature detected by the temperature sensor is greater than a predetermined value.

(3) In the shunt resistance type current sensor of (1) or (2), when the voltage detection unit determines that the temperature sensor is abnormal, the voltage detection unit outputs the calculated level of the electric current and the abnormality of the temperature sensor to an upper-level apparatus.

(4) The shunt resistance type current sensor of (1) further includes a high thermal conductivity material that is disposed between the bus bar and the circuit board to thermally connect the bus bar and the circuit board.

Advantageous Effects of Invention

According to the present invention, the temperature detection means is included as a means for detecting a temperature independently of the temperature sensor. As a result, the abnormality of the temperature sensor can be determined by comparing the temperature detected by the temperature detection means with the temperature detected by the temperature sensor. In addition, because the voltage detection means has the temperature detection means mounted therein, the abnormality of the temperature sensor can be determined by simply allowing the voltage detection means to execute such a determination logic, without adding new components.

BRIEF DESCRIPTION OF DRAWINGS

FIGS. 1A and 1B are side views schematically showing a shunt resistance type current sensor.

DESCRIPTION OF EMBODIMENTS

Figure 2:
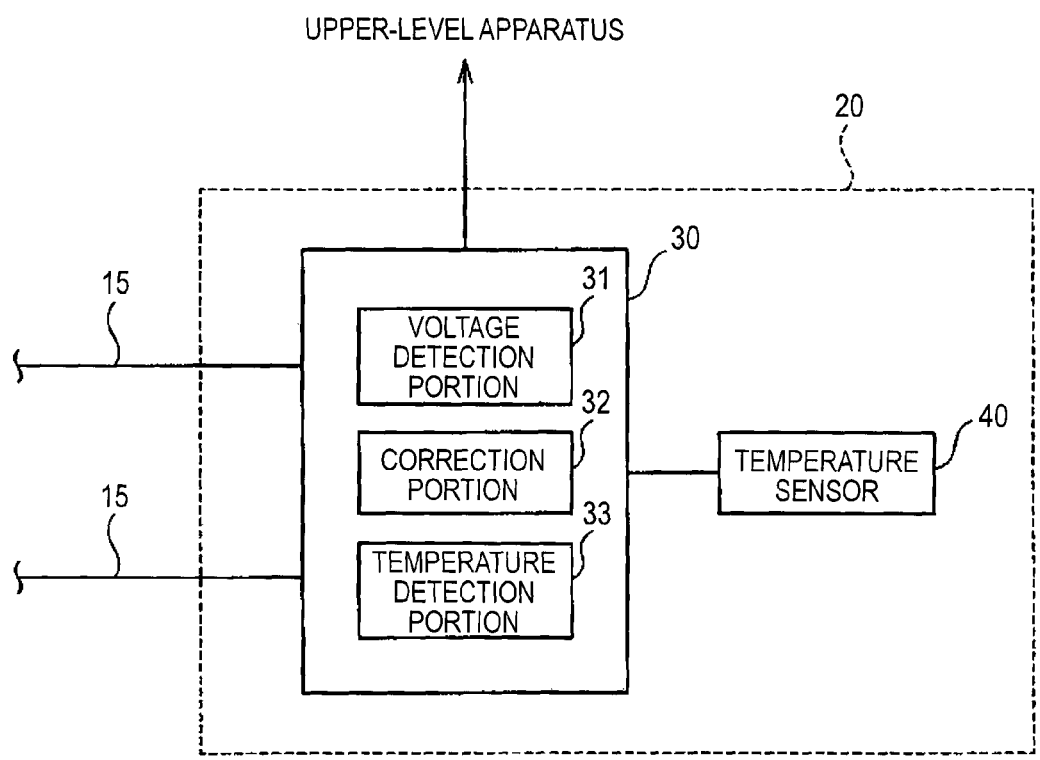
FIG. 2 is a block diagram showing a configuration of a voltage detection IC and a temperature sensor on a circuit board.

FIG. 1A is a side view schematically showing a shunt resistance type current sensor 1 according to the present embodiment, and FIG. 1B is an explanatory view showing a main part of the shunt resistance type current sensor 1 shown in FIG. 1A. The shunt resistance type current sensor 1 according to the present embodiment is used as a battery terminal and includes a bus bar 10, a circuit board 20, a voltage detection IC 30 and a temperature sensor 40.

The bus bar 10 is a conductive metal plate and consists of a flat portion 11, an upstream portion 12 and a downstream portion 13, and the upstream portion 12 and the downstream portion 13 are integrally formed with both ends of the flat portion 11 with the flat portion 11 interposed therebetween.

The flat portion 11 has a generally flat plate shape and severs as a shunt resistance portion. The circuit board 20 is installed over the flat portion 11 of the bus bar 10.

The upstream portion 12 has a battery terminal 12a provided to be extended from one upstream side of the flat portion 11. The battery terminal 12a is provided with a fitting hole extending therethrough in a left-right direction in the drawings, and has, at a distal end thereof, a pair of bolt inserting portions 12b formed to oppose and extend parallel to each other. The bolt inserting portions 12b are each provided with a hole for allowing a bolt B to be inserted therein, and thus the bolt B can extend through the holes and can be fastened by a nut (not shown). A battery post on a negative electrode side of a battery is inserted in the fitting hole of the battery terminal 12a, and the battery terminal 12a is fastened on the battery post by fastening the bolt B with the nut.

On the other hand, the downstream portion 13 has a stud erection portion 13a provided to be extended from one downstream side of the flat portion 11, and a stud bolt St protrudes from the stud erection portion 13a. The stud bolt St is connected with a terminal of a wire harness and is fastened by a nut.

An electric current from the battery flows through a load and then is returned to a negative terminal of the battery. The shunt resistance type current sensor 1 as the battery terminal is equipped in an electric current path, the wire harness on a minus side of the load is connected to the stud bolt St and the battery post on the negative electrode side of the battery is connected to the battery terminal 12a. As a result, the electric current flows through the wire harness, the stud bolt St, and the flat portion 11 to the battery terminal 12a and hence the battery post on the negative side.

The circuit board 20 is disposed over the flat portion 11 of the bus bar 10. The circuit board 20 is connected to both ends of the flat portion 11 as the shunt resistance portion through connecting members 15, such as lead wires. A circuit pattern is formed on the circuit board 20, and one end of the circuit pattern is electrically connected to the connecting members 15.

The voltage detection IC 30 is mounted on the circuit board 20 and is connected to the other end of the circuit pattern. The voltage detection IC 30 has a voltage detection portion 31, a correction portion 32 and a temperature detection portion 33, as schematically shown in FIG. 2.

The voltage detection portion 31 detects a voltage value applied to the circuit board 20 to detect a magnitude of an electric current to be measured flowing through the flat portion 11 of the bus bar 10. In other words, the voltage detection portion 31 detects a voltage drop generated in the flat portion 11 of the bus bar 10 by means of the connecting members 15 and then detects the magnitude of the electric current to be measured flowing through the bus bar 10 from the voltage drop and a resistance value of the flat portion 11.

The correction portion 32 performs a correction depending on a detection result of the temperature sensor 40 as described below. In other words, the correction portion 32 corrects the resistance value of the flat portion 11 depending on the detection result, to prevent an erroneous electric current value from being detected by an influence of resistance changes due to temperature changes.

The temperature detection portion 33 performs a function of detecting a temperature. Such a temperature detection means is provided independently of the temperature sensor 40 as described below, and is embodied by a detection device mounted inside the voltage detection IC 30.

The temperature sensor 40 detects a temperature in the vicinity of the bus bar 10, and the detection result is outputted to the voltage detection IC 30. As the temperature sensor 40, a diode temperature sensor or the like may be used. The temperature sensor 40 is provided on a surface of the circuit board 20 (i.e., a surface thereof facing the bus bar 10) opposite to a surface, on which the voltage detection IC 30 is mounted, and is disposed adjacent to the bus bar 10.

Also, a member having a large thermal conductivity so-called a high thermal conductivity material 50 is injected between the bus bar 10 and the entire surface of the circuit board 20. The high thermal conductivity material 50 thermally couples the bus bar 10 with the circuit board 20, thereby inhibiting a deviation between a temperature detected by the temperature sensor 40 and a temperature of the bus bar 10. As the high thermal conductivity material 50, a commercially available high thermal conductivity resin, in which a high thermal conductivity filler is for example added to a resin, may be used. As a result, the temperature of the bus bar 10 is quickly heat-transferred to the temperature sensor 40 through the high thermal conductivity material 50, so that the temperature sensor 40 accurately detects the temperature of the bus bar 10.

Figure 3:
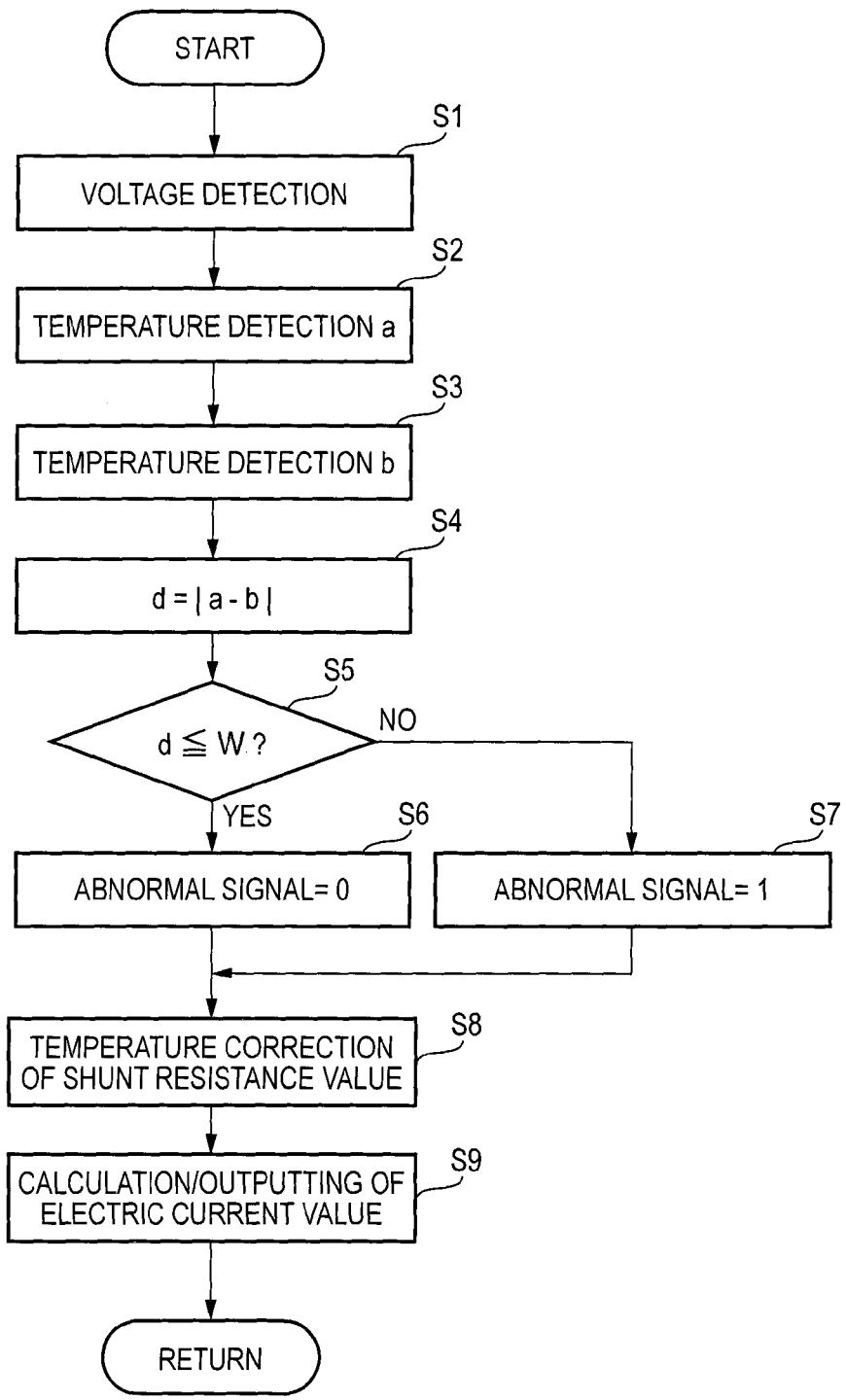
FIG. 3 is a flow chart showing an order of a current detection processing of the shunt resistance type current sensor.

FIG. 3 is a flow chart showing an order of a current detection processing of the shunt resistance type current sensor 1 according to the present embodiment. The processing shown in the flow chart is performed by the voltage detection IC 30.

Firstly, in a step 1 (S1), the voltage detection IC 30 detects a voltage value applied to the circuit board 20, i.e., the flat portion 11 of the bus bar 10. In a step 2 (S2), the voltage detection IC 30 detects a temperature by the temperature sensor 40 disposed on the back surface of the circuit board 20. By this temperature detection, a first temperature "a" is obtained.

In a step 3 (S3), the voltage detection IC 30 detects a temperature by the temperature detection portion 33 which is constituted by the detection device mounted inside the voltage detection IC 30. By this temperature detection, a second temperature "b" is obtained.

In a step 4 (S4), the voltage detection IC 30 calculates a difference (absolute value) between the first temperature "a" and the second temperature "b" as a temperature difference "d".

In a step 5 (S5), the voltage detection IC 30 determines whether the temperature difference "d" is smaller than a predetermined abnormality determination value W or not. If the determination in the step 5 is positive, in other words, if the temperature difference "d" is smaller than the abnormality determination value W, the processing proceeds to a step 6 (S6). Contrarily, if the determination in the step 5 is negative, in other words, if the temperature difference "d" is greater than the abnormality determination value W, the processing proceeds to a step 7 (S7).

In the step 6, the voltage detection IC 30 sets a flag indicating an output of an abnormal signal to "0", which indicates that there is no abnormality. Contrarily, in the step 7, the voltage detection IC 30 sets the flag indicating an output of an abnormal signal to "1", which indicates that there is an abnormality.

In a step 8 (S8), the voltage detection IC 30 performs temperature-correction to a resistance value of the flat portion 11 corresponding to the shunt resistance portion. Specifically, the resistance value of the flat portion 11, which is a premise of electric current calculations, is corrected on the basis of the first temperature "a". For example, the voltage detection IC 30 holds a map or a calculation equation indicating a correlation between the first temperature "a" and the resistance value of the flat portion 11 in which a correction value is considered, and thus the resistance value of the shunt resistance portion, to which the temperature correction is applied, can be consistently calculated depending on the first temperature "a".

In a step 9 (S9), the voltage detection IC 30 calculates a magnitude (electric current) of an electric current to be measured on the basis of the temperature-corrected resistance value of the shunt resistance portion and the voltage value detected in the step 1. The calculated electric current is outputted to an upper-level apparatus connected to the shunt resistance type current sensor 1. In addition, if the flag indicating an output of an abnormal signal is "1", the voltage detection IC 30 also outputs the abnormal signal indicating abnormality of the temperature sensor to the upper-level apparatus, together with outputting of the electric current.

As described above, according to the present embodiment, the shunt resistance type current sensor 1 includes the bus bar 10 becoming a path of an electric current to be measured; the circuit board 20 installed over the bus bar 10; the connecting members 15 as a pair of connecting members for electrically connecting the circuit board 20 with the bus bar 10; the voltage detection IC (voltage detection means) 30 provided on the circuit board 20 and adapted for detecting a voltage value applied to the circuit board 20 through the pair of connecting members 15 to detect a magnitude of the electric current to be measured flowing through the bus bar 10; and the temperature sensor 40 provided on a surface of the circuit board 20 facing the bus bar 10 and adapted for detecting a temperature of the bus bar 10 to allow the voltage detection IC 30 to perform a correction. In this case, the voltage detection IC 30 has the temperature detection portion 33 provided and mounted therein for detecting a temperature independently of the temperature sensor 40, and determines an abnormality of the temperature sensor 40 on the basis of the temperature (second temperature "b") detected by the temperature detection portion 33 and the temperature (first temperature "a") detected by the temperature sensor 40.

According to this configuration, the temperature detection portion 33 is included as a means for detecting a temperature independently of the temperature sensor 40. As a result, the abnormality of the temperature sensor 40 can be determined by comparing the second temperature "b" detected by the temperature detection portion 33 with the first temperature "a" detected by the temperature sensor 40. In addition, because the voltage detection IC 30 has the temperature detection portion 33 mounted therein, the abnormality of the temperature sensor 40 can be determined by simply allowing the voltage detection IC 30 to execute such a determination logic, without adding new components.

Also, according to the present embodiment, the voltage detection IC 30 determines that the temperature sensor 40 is abnormal, when a difference between the second temperature "b" detected by the temperature detection portion 33 and the first temperature "a" detected by the temperature sensor 40 is greater than a predetermined determination value W.

A temperature detection error of the temperature detection portion 33 is about ±3° C. relative to the temperature of the bus bar 10. Also, a temperature detection error of the temperature sensor 40 is about ±2° C. relative to the temperature of the bus bar 10. Thus, there may be a maximum error of about 5° C. at a difference between the first temperature "a" and the second temperature "b". Therefore, by setting the abnormality determination value W to a value greater than 5° C., for example, to 10° C., the abnormality of the temperature sensor 40 can be determined upon the condition that a difference exceeding such a typical error occurs between the first temperature a and the second temperature b.

In addition, according to the present embodiment, when the voltage detection IC 30 determines that the temperature sensor 40 is abnormal, the voltage detection IC 30 outputs the detected magnitude of the electric current to be measured to the upper-level apparatus, and at the same time, outputs the abnormality of the temperature sensor 40 to the upper-level apparatus.

As a result, the abnormality of the temperature sensor 40 can be appropriately notified to the upper-level apparatus.

Meanwhile, because an abnormality which is a relative comparison between the temperature sensor 40 and the temperature detection portion 33 of the voltage detection IC 30 is determined, when the voltage detection IC 30 determines that the temperature sensor 40 is abnormal, an abnormality of the temperature detection portion 33 of the voltage detection IC 30 can be relatively determined, even if the temperature sensor 30 is not actually abnormal.

In the foregoing, although the shunt resistance type current sensor according to the present embodiment has been described, the present invention is not limited to the embodiment, and accordingly, various modifications can be made within the scope of the invention. For example, the bus bar not only has a configuration in which the shunt resistance portion is included in a part thereof, but also the whole thereof may serve as the shunt resistance portion.

The present application is based on Japanese Patent Application No. 2012-155187, filed on Jul. 11, 2012, the entire contents of which are incorporated herein by reference.

INDUSTRIAL APPLICABILITY

There is provided a shunt resistance type current sensor capable of determining the abnormality of the temperature sensor without adding new components.

REFERENCE SIGNS LIST

1 Shunt resistance type current sensor
10 Bus bar
11 Flat portion
12 Upstream portion
12a Battery terminal
12b Bolt inserting portions
13 Downstream portion
13a Stud erection portion
15 Connecting members
20 Circuit board
30 Voltage detection IC
31 Voltage detection portion
32 Correction portion
33 Temperature detection portion
40 Temperature sensor
B Bolt
St Stud bolt

The invention claimed is:

1. A shunt resistance type current sensor comprising:
a bus bar that is a path of an electric current to be measured;
a circuit board that is installed over the bus bar;
a pair of connecting members that electrically connect the circuit board with the bus bar;
a voltage detection unit that is provided on the circuit board and detects a voltage value applied to the circuit board through the pair of connecting members so as to calculate a level of the electric current flowing through the bus bar; and
a temperature sensor that is provided on the circuit board to face the bus bar and detects a temperature of the bus bar to allow the voltage detection unit to perform a correction regarding the calculation of the level of the electric current;

wherein the voltage detection unit includes a temperature detection portion for detecting the temperature of the bus bar, and determines an abnormality of the temperature sensor based on the temperature detected by the temperature detection portion and the temperature detected by the temperature sensor.

2. The shunt resistance type current sensor according to claim 1, wherein the voltage detection unit determines that the temperature sensor is abnormal, when a difference between the temperature detected by the temperature detection portion and the temperature detected by the temperature sensor is greater than a predetermined value.

3. The shunt resistance type current sensor according to claim 1 further comprising a high thermal conductivity material that is disposed between the bus bar and the circuit board to thermally connect the bus bar and the circuit board.

* * * * *